United States Patent

Yamashiro

(12) United States Patent
(10) Patent No.: US 11,177,777 B2
(45) Date of Patent: Nov. 16, 2021

(54) TEMPERATURE DETECTION CIRCUIT, POWER AMPLIFICATION CIRCUIT, AND ELECTRONIC DEVICE

(71) Applicant: Murata Manufacturing Co., Ltd., Kyoto (JP)

(72) Inventor: Hideyo Yamashiro, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 35 days.

(21) Appl. No.: 16/727,072

(22) Filed: Dec. 26, 2019

(65) Prior Publication Data

US 2020/0212850 A1 Jul. 2, 2020

(30) Foreign Application Priority Data

Dec. 28, 2018 (JP) .............................. JP2018-246804

(51) Int. Cl.
| | |
|---|---|
| *H03F 1/30* | (2006.01) |
| *G01K 7/01* | (2006.01) |
| *H03F 3/24* | (2006.01) |
| *H03F 3/195* | (2006.01) |
| *G05F 1/46* | (2006.01) |
| *H03F 3/45* | (2006.01) |

(52) U.S. Cl.
CPC ............. *H03F 1/304* (2013.01); *G01K 7/015* (2013.01); *G05F 1/468* (2013.01); *H03F 3/195* (2013.01); *H03F 3/245* (2013.01); *H03F 3/45076* (2013.01); *H03F 2200/27* (2013.01); *H03F 2200/447* (2013.01); *H03F 2200/468* (2013.01)

(58) Field of Classification Search
CPC ....................................................... H03F 1/30

USPC ........................................ 330/289, 296, 285
See application file for complete search history.

(56) References Cited

U.S. PATENT DOCUMENTS

| | | | | |
|---|---|---|---|---|
| 7,439,808 | B2* | 10/2008 | Inamori | ................ H03F 1/30 330/289 |
| 7,705,658 | B2* | 4/2010 | Yamamoto | ............ G01R 21/12 327/478 |
| 10,014,886 | B2 | 7/2018 | Whittaker | |
| 10,056,874 | B1 | 8/2018 | Ranta | |
| 2003/0071688 | A1 | 4/2003 | Wang et al. | |
| 2009/0251220 | A1 | 10/2009 | Matsuda et al. | |
| 2020/0309606 | A1* | 10/2020 | Nomiya | ................... G01K 7/01 |

FOREIGN PATENT DOCUMENTS

| | | |
|---|---|---|
| JP | 2009-253728 A | 10/2009 |
| JP | 2014-192805 A | 10/2014 |

OTHER PUBLICATIONS

Japanese Office action for Application No. 2018-246804 dated May 18, 2021.

* cited by examiner

*Primary Examiner* — Henry Choe
(74) *Attorney, Agent, or Firm* — Pearne & Gordon LLP

(57) ABSTRACT

Provided is a temperature detection circuit that includes: a series connection circuit that is connected between a power supply voltage input terminal and ground and includes a temperature detection transistor and a first resistance element; and a current bypass circuit that includes a first transistor that is connected in parallel with the temperature detection element and allows a bypass current to flow therethrough. The temperature detection circuit outputs a temperature detection signal from a connection point between the temperature detection transistor and the first resistance element.

18 Claims, 7 Drawing Sheets

TEMPERATURE DETECTION CIRCUIT, POWER AMPLIFICATION CIRCUIT, AND ELECTRONIC DEVICE

This application claims priority from Japanese Patent Application No. 2018-246804 filed on Dec. 28, 2018. The content of this application is incorporated herein by reference in its entirety.

BACKGROUND OF THE DISCLOSURE

1. Field of the Disclosure

The present disclosure relates to a temperature detection circuit that detects the temperature of a temperature detection target circuit having an operation characteristic that has a temperature dependence, and relates to a power amplification circuit and an electronic device that include the temperature detection circuit.

2. Description of the Related Art

For example, a wireless communication device includes a power amplification circuit that amplifies the power of a transmission signal and outputs the amplified transmission signal to an antenna.

The amplification factor of the power amplifier that amplifies the power of the transmission signal has a temperature dependence, and the amplification factor of the power amplifier changes as time passes due to the heat generated by the power amplifier itself. U.S. Pat. No. 10,056,874 discloses a circuit that compensates an appropriate amplification factor in accordance with the heat generated by the power amplifier itself.

The temperature compensation circuit disclosed in U.S. Pat. No. 10,056,874 is configured to detect a reference temperature of the power amplifier, generate a voltage signal in accordance with a rise in temperature from the reference temperature, and control the amplification factor of the power amplifier by changing the bias voltage of a transistor of the power amplifier using this voltage signal.

In the temperature compensation circuit disclosed in U.S. Pat. No. 10,056,874, the amplification factor is appropriately compensated in accordance with the heat generated by the power amplifier itself when there is a linear relationship between a change in the voltage of the voltage signal that occurs with a rise in temperature and the change in the temperature of the power amplifier itself. However, when the surrounding temperature of the power amplifier becomes high, the change in the voltage of the voltage signal of the power amplifier that occurs with a rise in temperature and the change in the temperature of the power amplifier itself are not linear and therefore the amplification factor of the power amplifier is not appropriately compensated. Consequently, there is a problem in that the error vector magnitude (EVM) of a transmission signal that should be kept small in a power amplifier used for wireless communication undesirably increases.

BRIEF SUMMARY OF THE DISCLOSURE

Accordingly, as an embodiment of the present disclosure, a temperature detection circuit includes a series connection circuit that is connected between a power supply voltage input terminal and ground. The series connection circuit includes a temperature detection element and a first resistance element. A temperature detection circuit further includes a current bypass circuit including a first transistor that is connected in parallel with the temperature detection element and allows a bypass current to flow therethrough.

A temperature detection signal is outputted from a connection part between the temperature detection element and the first resistance element.

Furthermore, as an embodiment of the present disclosure, a power amplification circuit includes: the temperature detection circuit; and a power amplifier that performs power amplification using a bias voltage in accordance with the temperature detection signal. The temperature detection target circuit is the power amplifier.

Furthermore, as an embodiment of the present disclosure, an electronic device includes: the power amplification circuit; and a heat-generating component. The heat-generating component and the power amplifier are mounted on the same substrate.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Figure 1:
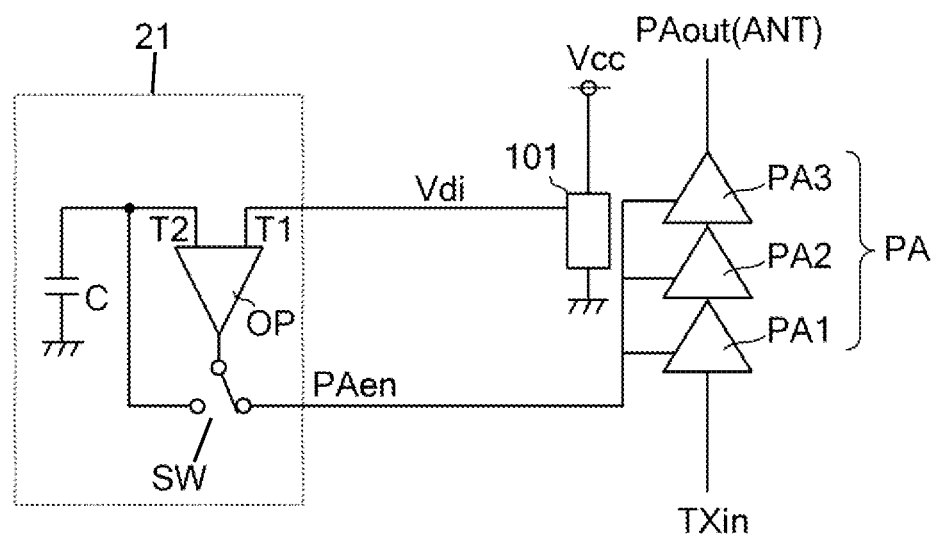
FIG. 1 is a circuit diagram of a power amplification circuit according to a first embodiment.

First, a temperature detection circuit, a power amplification circuit, and an electronic device according to a number of modes of the present disclosure will be described.

A temperature detection circuit according to a first mode of the present disclosure includes: a series connection circuit that is connected between a power supply voltage input terminal and ground and includes a temperature detection element including a PN junction that detects a temperature of a detection target circuit, and a first resistance element; a current bypass circuit that includes a first bipolar transistor, is connected in parallel with the temperature detection element, and allows a bypass current to flow therethrough;

and a resistance voltage divider circuit that generates a bias voltage for the first transistor. The temperature detection circuit outputs a temperature detection signal from a connection part between the temperature detection element and the first resistance element.

According to a second mode of the present disclosure, the temperature detection circuit further includes a second transistor. A reference terminal (source/emitter) and a current input/output terminal (drain/collector) of the second transistor are serially connected between the series connection circuit and the power supply voltage input terminal, and a control voltage is applied to a control terminal (gate/base) of the second transistor. With this configuration, even if the power supply voltage fluctuates, a high-accuracy temperature detection signal can be obtained provided that the control voltage is stable.

In a third mode of the present disclosure, the temperature detection circuit further includes: a second resistance element that is serially connected to a reference potential terminal (emitter) of the first transistor. With this configuration, the proportion of the current that is bypassed to the current bypass circuit can be determined in accordance with the resistance value of the second resistance element, and consequently the amplification factor can be more appropriately compensated with respect to the surrounding temperature.

A power amplification circuit according to a fourth mode of the present disclosure includes: the temperature detection circuit according to any of the above-described modes; a bias control signal generating circuit that receives the temperature detection signal and generates a bias control signal; and a power amplifier that receives the bias control signal and performs power amplification using a bias voltage in accordance with the bias control signal. The power amplifier is the temperature detection target circuit. With this configuration, as the surrounding temperature rises, the rate of the increase of the amplification factor of the power amplifier can be increased with the rise in temperature, and therefore compared with the configuration in which the current bypass circuit is not provided, the amplification factor can be appropriately compensated over a wide surrounding temperature range.

In a fifth mode of the present disclosure, in the power amplification circuit, the power amplifier, the temperature detection circuit, and the bias control signal generating circuit are formed in a single semiconductor chip. With this configuration, the temperature detection circuit detects the temperature of the power amplifier under a low thermal resistance, and therefore high responsiveness can be realized for compensation of the amplification factor.

In a sixth mode of the present disclosure, in the power amplification circuit, the bias control signal generating circuit includes a differential amplification circuit, the temperature detection circuit being connected to a first input terminal thereof, a capacitor that is connected to a second input terminal of the differential amplification circuit, and a switch that is connected to an output of the differential amplification circuit and switches between a state in which an output voltage of the differential amplification circuit charges the capacitor and a state in which the output voltage of the differential amplification circuit is outputted to the power amplifier as the temperature detection signal. With this configuration, a bias control signal that is determined in accordance with a rise in temperature of the power amplifier can be easily obtained.

An electronic device according to a seventh mode of the present disclosure includes: the power amplification circuit; and a heat-generating component. The heat-generating component and the power amplifier are mounted on the same substrate. In the thus-structured electronic device as well, the bias voltage for the power amplifier is appropriately determined in accordance with the temperature of the power amplifier.

Hereafter, a plurality of modes for carrying the present disclosure will be described by giving a number of specific examples while referring to the drawings. Identical parts are denoted by identical symbols in the drawings. Taking explanation of important points or ease of understanding into account, the embodiments are described in a separate manner for the sake of convenience, but parts of the configurations illustrated in the different embodiments may be substituted for one another or combined with each other. In the second embodiment and embodiments thereafter, the description of the matters common to the first embodiment is omitted and only the differences are described. In particular, the same operational effects resulting from the same configurations will not be repeatedly described in the individual embodiments.

First Embodiment

FIG. 1 is a circuit diagram of a power amplification circuit 201 according to a first embodiment. The power amplification circuit 201 includes a power amplifier PA, a power amplifier temperature detection circuit 101, and a bias control signal generating circuit 21 that receives a temperature detection signal Vdi and generates a bias control signal PAen for the power amplifier PA.

The power amplifier PA consists of a first stage power amplifier PA1, a second stage power amplifier PA2, and a third stage power amplifier PA3, which are sequentially cascade connected to each other. The power amplifier PA amplifies the power of a transmission signal inputted to a transmission signal input terminal Txin thereof and outputs the amplified transmission signal from an output terminal PAout thereof. For example, an antenna is directly or indirectly connected to the output terminal PAout.

The power amplifier temperature detection circuit 101 is thermally coupled to the power amplifier PA and generates the temperature detection signal Vdi in accordance with the temperature of the power amplifier PA. In other words, the power amplifier temperature detection circuit 101 receives (detects) the heat generated in the power amplifier PA and generates the temperature detection signal Vdi in accordance with the temperature of the power amplifier PA.

The bias control signal generating circuit 21 is a circuit that outputs the bias control signal PAen to the power amplifier PA based on the temperature detection signal Vdi. The bias control signal generating circuit 21 includes an operational amplifier OP, a capacitor C, and a switch SW. The power amplifier temperature detection circuit 101 is connected to a first input terminal T1 of the operational amplifier OP and the capacitor C is connected to a second input terminal T2 of the operational amplifier OP. The switch SW is connected to the output of the operational amplifier OP and the switch SW switches between a state in which the capacitor C is charged with the output voltage of the operational amplifier OP and a state in which the bias control signal PAen is outputted to the power amplifier PA.

First, at the time when operation of the power amplifier PA starts, the switch SW is in the state where the capacitor C is charged with the output voltage of the operational amplifier OP. In other words, when operation of the power amplifier PA starts, the capacitor C is charged with the voltage of the temperature detection signal Vdi inputted to the first input terminal T1 from the power amplifier temperature detection circuit 101 as a voltage that represents a reference temperature of the power amplifier PA at the time when operation of the power amplifier PA starts. Next, the switch SW outputs the output voltage of the operational amplifier OP to the power amplifier PA as the bias control signal PAen. In other words, once operation of the power amplifier PA has started, the output voltage from the operational amplifier OP, which is generated by comparing the voltage of the temperature detection signal Vdi inputted each time from the first input terminal T1 of the operational amplifier OP and the voltage representing the reference temperature with which the capacitor C has been charged and inputted from the second input terminal T2, is outputted to the power amplifier PA as the bias control signal PAen.

The amplification factor of the power amplifier PA increases as the voltage of the bias control signal PAen increases. Therefore, the power amplifier PA can be controlled using the above-described configuration and operation in order that a fall in the amplification factor of the power amplifier PA occurring with an increase in temperature is suppressed and an appropriate amplification factor is maintained. The operational amplifier OP corresponds to a "differential amplification circuit" of the present disclosure.

Figure 2A:
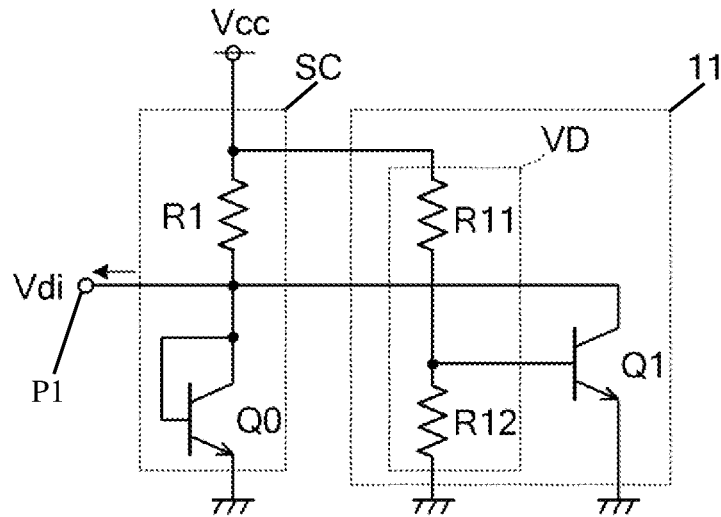
FIG. 2A is a circuit diagram of a power amplifier temperature detection circuit and FIG. 2B is a circuit diagram of another power amplifier temperature detection circuit.

Next, specific examples of the configuration of the temperature detection circuit 101 will be described. FIG. 2A is a circuit diagram of a temperature detection circuit 101A and FIG. 2B is a circuit diagram of a temperature detection circuit 101B.

The temperature detection circuit 101A illustrated in FIG. 2A includes a series connection circuit SC and a current bypass circuit 11. The series connection circuit SC is a series connection circuit consisting of a temperature detection transistor Q0 and a first resistance element R1, and the series connection circuit SC is connected between a power supply voltage input terminal Vcc and ground. A signal output terminal P1 is connected to a connection part between the temperature detection transistor Q0 and the first resistance element R1, and the temperature detection signal Vdi is outputted from the signal output terminal P1. In other words, the signal output terminal P1 is connected to a node on a path connecting the temperature detection transistor Q0 and the first resistance element R1. The temperature detection transistor Q0 is a bipolar transistor in which the collector and base are directly connected to each other, i.e., a diode-connected transistor. The temperature detection transistor Q0 corresponds to a "temperature detection element" of the present disclosure.

The current bypass circuit 11 includes a first bipolar transistor Q1 that is thermally coupled with the power amplifier. The first transistor Q1 is connected in parallel with the temperature detection transistor Q0 and allows a bypass current to flow therethrough. Furthermore, the current bypass circuit 11 includes a resistance voltage divider circuit VD that generates a bias voltage for the first transistor Q1. The resistance voltage divider circuit VD is formed of a series circuit consisting of a resistance element R11 and a resistance element R12, and the resistance voltage divider circuit VD is connected between the power supply voltage input terminal Vcc and ground. A bias voltage generated by the resistance voltage divider circuit VD is supplied to a control terminal of the first transistor Q1.

Figure 2B:
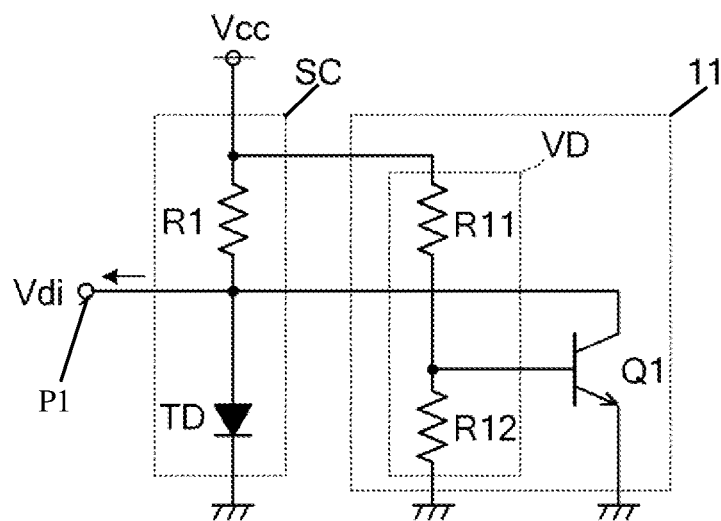

The temperature detection circuit 101B illustrated in FIG. 2B includes a temperature detection diode TD as the "temperature detection element". The temperature detection diode TD operates in the same manner as the diode-connected temperature detection transistor Q0. The rest of the configuration is the same as that of the temperature detection circuit 101A illustrated in FIG. 2A.

Operation of the temperature detection circuits 101A and 101B illustrated in FIGS. 2A and 2B is as follows.

In FIG. 2A, when the ratio of the voltage reduction with the resistance value of the first resistance element R1 with respect to the voltage across the two ends of the temperature detection transistor Q0 is sufficiently large, the series connection circuit SC will substantially operate as a constant current circuit (i.e., the larger the value of the ratio is, the more likely it is for the series connection circuit SC substantially to operate as a constant current circuit). In other words, the voltage (temperature detection signal Vdi) outputted from the connection part between the temperature detection transistor Q0 and the first resistance element R1 changes in accordance with the temperature dependence of the temperature detection transistor Q0. Specifically, a voltage V across the two ends of the temperature detection transistor Q0 (i.e., the voltage of the temperature detection signal Vdi) can be expressed as V=Vg−BT. Here, Vg is a bandgap voltage, T is the absolute temperature, and B is a coefficient related to the absolute temperature, and B is a constant when a current that flows though the temperature detection transistor Q0 is constant.

In other words, in the case of the structure of the related art in which the current bypass circuit 11 is not provided (is not connected), a value obtained by subtracting Vg from the voltage V of the temperature detection signal Vdi is dependent on the temperature of the temperature detection transistor Q0.

However, when the current bypass circuit 11 is provided as in this embodiment, the relationship between the temperature detection signal Vdi and temperature changes as follows.

The base bias voltage of the first transistor Q1 is constant, and therefore the relationship between a collector current Ic of the first transistor Q1 and a temperature T can be simply expressed by the following relational expression.

$$I_C \propto CT^{(4-n)} \exp\left(-\frac{V_{GO}}{V_T}\right) \exp\left(\frac{V_{be}}{V_T}\right) \qquad \text{[Math 1]}$$

Here, VGO is an absolute zero degrees voltage obtained by a linear approximation of the band gap voltage, VT is a thermal voltage, and Vbe is the base-emitter voltage of the first transistor Q1. Furthermore, C is a constant and n is a constant that changes depending the manufacturing process of the first transistor Q1.

Therefore, as the temperature rises, a bypass current flowing through the first transistor Q1 increases and the current flowing through the temperature detection transistor Q0 decreases by that amount. That is, the rate of the decrease of the voltage of the temperature detection signal Vdi with respect to the actual temperature rise increases.

Generally, the amplification factor of an exemplary power amplifier falls as the temperature of the power amplifier rises, and therefore a bias voltage is generated in order that the amplification factor of the power amplifier increases as the detected temperature rises. However, since the temperature of the power amplifier is the sum of the temperature corresponding to the heat generated by the power amplifier itself and the surrounding temperature, as the surrounding temperature rises, the rate of the increase of the amplification factor accompanying the rise in temperature becomes insufficient.

However, due to the operation with the current bypass circuit as written above, as the surrounding temperature rises, the rate of the decrease of the voltage of the temperature detection signal Vdi increases and the rate of the increase of the amplification factor of the power amplifier PA due to the bias control signal PAen increases with the rise in temperature.

As a result, compared with the configuration in which the current bypass circuit is not provided, the amplification factor is appropriately compensated across a wide surrounding temperature range.

Figure 3:
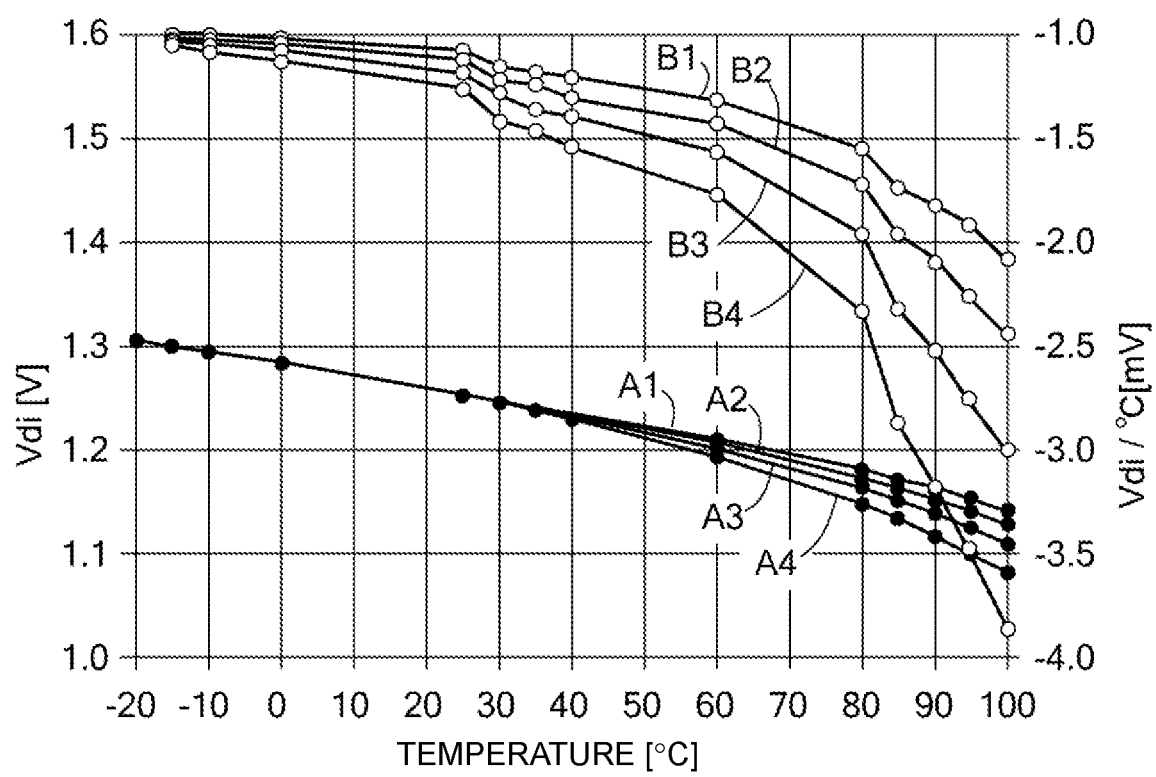
FIG. 3 is a diagram illustrating the relationship between the temperature of a temperature detection transistor and a temperature detection signal.
Figure 9:
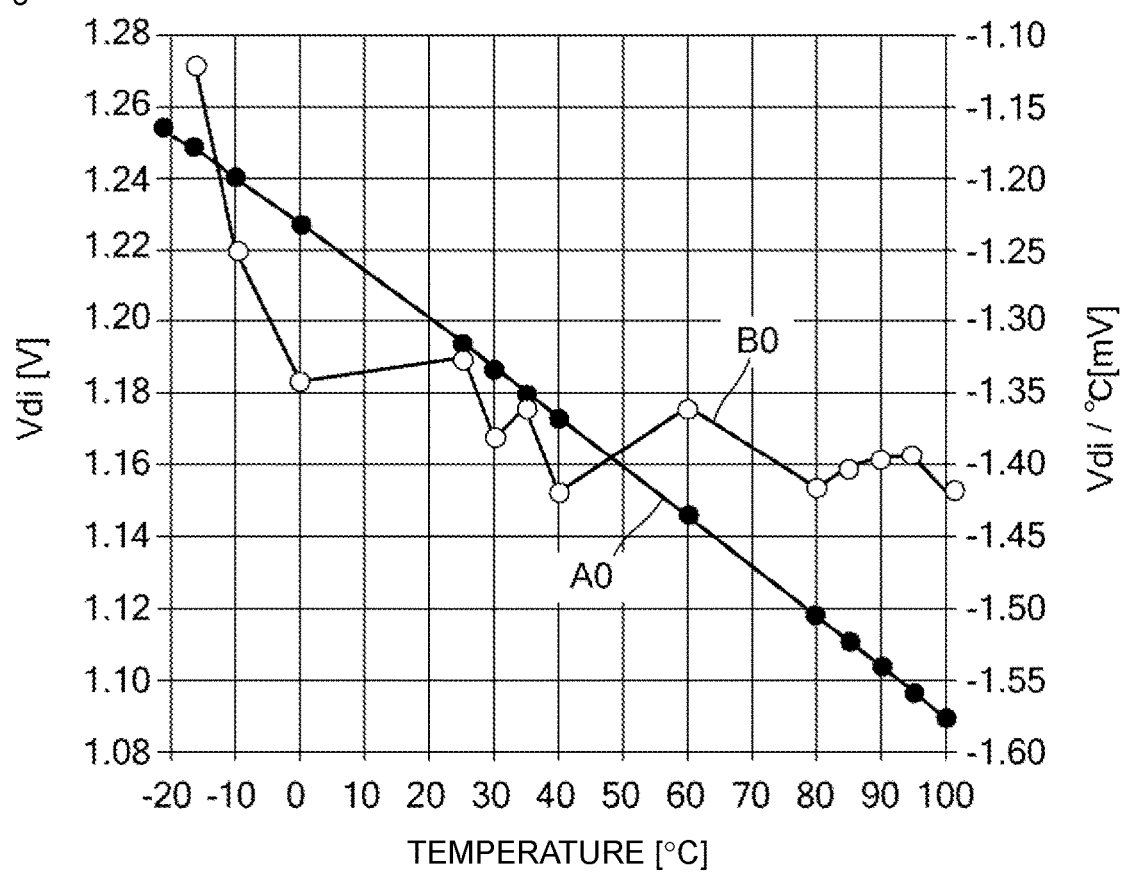
FIG. 9 is a diagram illustrating the relationship between the temperature of a temperature detection diode of a power amplifier temperature detection circuit of a comparative example and a temperature detection signal.

FIG. 3 is a diagram illustrating the relationship between the temperature of the temperature detection transistor Q0 (detection temperature of power amplifier temperature detection circuit 101) and the temperature detection signal Vdi. FIG. 9 is a diagram illustrating the relationship between the temperature of a temperature detection diode of a temperature detection circuit of a comparative example and a temperature detection signal Vdi. The temperature detection circuit of the comparative example is a circuit consisting of just the series connection circuit SC illustrated in FIG. 2B.

In FIGS. 3 and 9, the horizontal axis represents the temperature of the power amplifier PA (detection temperature of temperature detection circuit 101), the scale on the left side vertical axis represents the voltage value of the temperature detection signal Vdi, and the scale on the right side vertical axis represents the change in the temperature detection signal Vdi with respect to the change in temperature (° C.). A characteristic line A0 in FIG. 9 represents the relationship between the temperature in the power amplifier temperature detection circuit of the comparative example and the temperature detection signal Vdi. Furthermore, a characteristic line B0 represents the relationship between the temperature and a change in voltage of the temperature detection signal Vdi with respect to a change in temperature. Characteristic lines A1 to A4 in FIG. 3 represent relationships between the temperature in the power amplifier temperature detection circuit and the temperature detection signal Vdi. Furthermore, characteristic lines B1 to B4 represent relationships between a change in temperature in the power amplifier temperature detection circuit and a change in voltage of the temperature detection signal. Here, the base bias voltage of the first transistor Q1 when the characteristic lines are obtained are as follows.

A1, B1 1.84 V
A2, B2 1.86 V
A3, B3 1.88 V
A4, B4 1.9 V

As illustrated in FIG. 9, the relationship between the temperature of the temperature detection diode of the temperature detection circuit of the comparative example and the temperature detection signal Vdi is linear and the change in voltage of the temperature detection signal Vdi with respect to the change in temperature (slope) is approximately constant at around −1.4/° C.

In contrast, in this embodiment, as described above, the current bypass circuit 11 is provided and the size of the bypass current changes in accordance with the temperature of the power amplifier, and as a result the change in voltage of the temperature detection signal Vdi with respect to the change in temperature (slope) increases as the temperature of the power amplifier becomes higher. Consequently, as the temperature of the power amplifier rises, the rate of the increase of the amplification factor increases together with the rise in temperature, and compared with configuration in which the current bypass circuit is not provided, the amplification factor can be appropriately compensated over a wider temperature range.

Figure 4A:
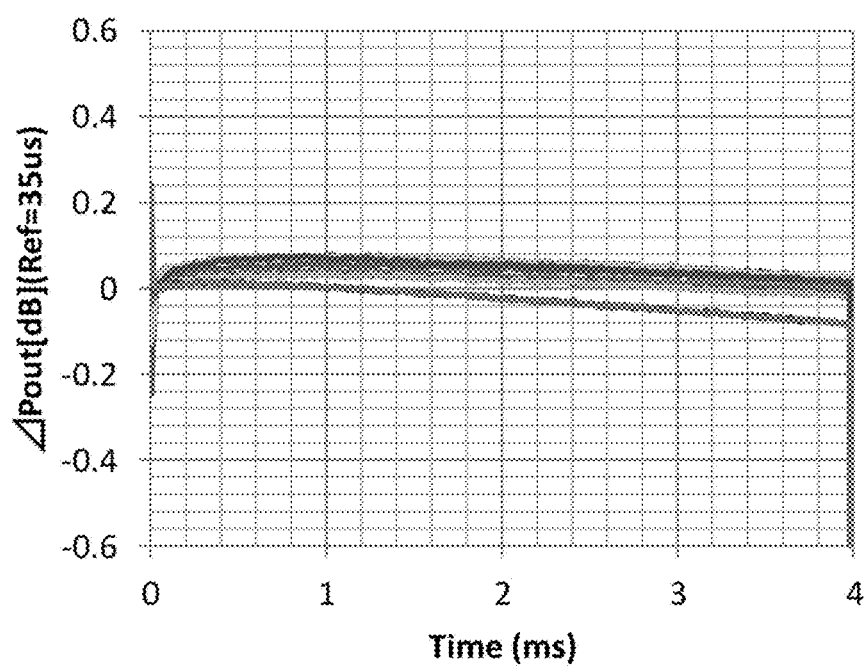
FIG. 4A and FIG. 4B are diagrams illustrating changes that occur in the output powers of power amplifiers as the time elapses from the start of operation of the power amplifiers.
Figure 4B:
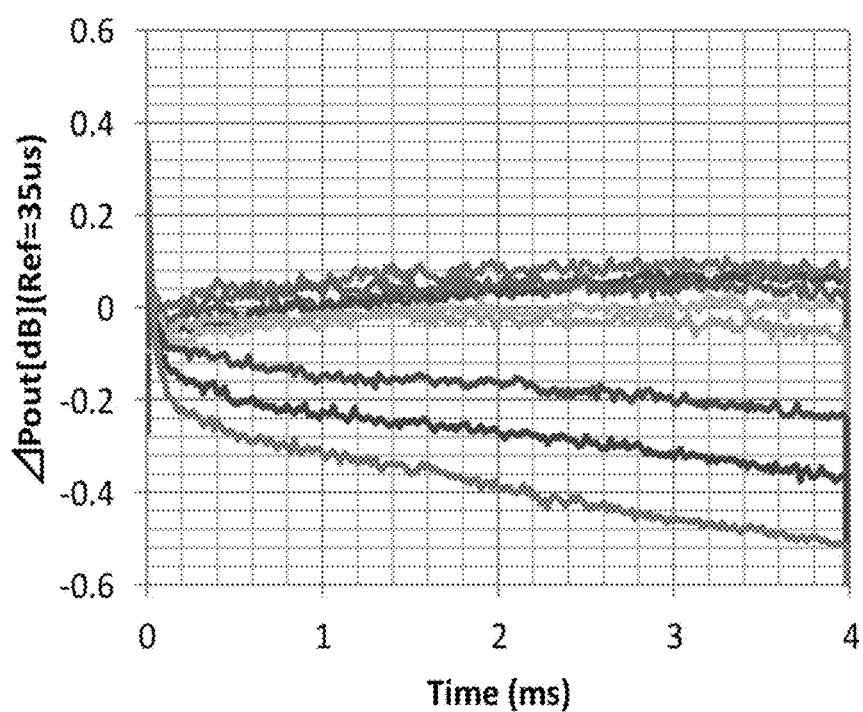

FIG. 4A and FIG. 4B are diagrams illustrating changes in the output powers of power amplifiers as the time elapses from the start of operation of the power amplifiers. FIG. 4A illustrates the characteristic of the power amplification circuit 201 of this embodiment and FIG. 4B illustrates the characteristic of a power amplification circuit serving as a comparative example. The power amplification circuit of the comparative example includes a temperature detection circuit that does not include the current bypass circuit 11 in FIG. 2A.

In FIGS. 4A and 4B, the horizontal axis represents the time elapsed from the start of operation of the power amplifier and the vertical axis represents the rate of change of the output power of the power amplifier. In both cases, the power 35 μs after the start of the operation of the power amplifier is used as a reference.

In FIGS. 4A and 4B, a large number of characteristic lines illustrate the results obtained when the voltage of the power supply voltage input terminal Vcc and the temperature of the surrounding environment of the power amplifier are varied. The values are as follows in order from the top characteristic line.

FIG. 4A
Vcc=3.15 V, −20° C.
Vcc=3.8 V, −20° C.
Vcc=4.75 V, −20° C.
Vcc=3.15 V, 25° C.
Vcc=3.8 V, 25° C.
Vcc=4.75 V, 25° C.
Vcc=3.15 V, 85° C.
Vcc=3.8 V, 85° C.
Vcc=4.75 V, 85° C.
FIG. 4B
Vcc=3.0 V, −20° C.
Vcc=3.3 V, −20° C.
Vcc=3.6V, −20° C.
Vcc=3.0 V, 25° C.
Vcc=3.3V, 25° C.
Vcc=3.6V, 25° C.
Vcc=3.0V, 85° C.
Vcc=3.3V, 85° C.
Vcc=3.6V, 85° C.

According to this embodiment, variations in the amplification factor (gain drift) caused by an increase in temperature of the power amplifier are suppressed even when the temperature of the power amplifier varies due to the effect of the surrounding temperature. Therefore, gain drift is suppressed even across a wide surrounding temperature range.

Figure 5:
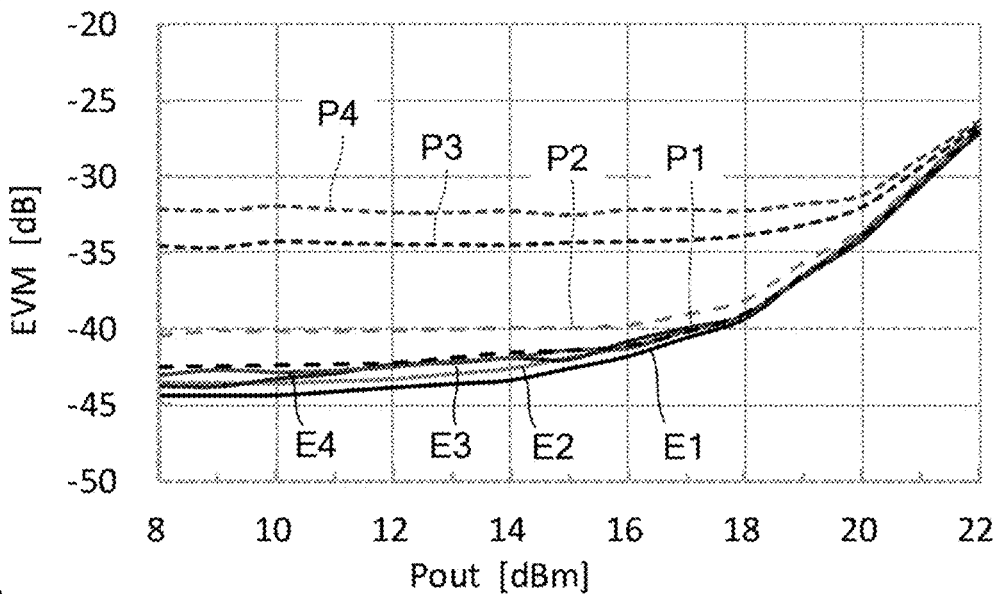
FIG. 5 illustrates the relationship between the output power of a power amplifier and error vector magnitude (EVM)

FIG. 5 illustrates the relationship between the output power of a power amplifier and error vector magnitude (EVM). The horizontal axis in FIG. 5 represents the output power of the power amplifier and the vertical axis represents EVM. Characteristic lines E1 to E4 in FIG. 5 are characteristics of a power amplification circuit that includes the bias control signal generating circuit 21 and characteristic lines P1 to P4 in FIG. 5 are the characteristics of a power amplification circuit that does not include the bias control signal generating circuit 21. Here, the relationship between each characteristic line and the driving time of the power amplifier are as follows.

E1, P1 80 μs
E2, P2 1 ms
E3, P3 2 ms
E4, P4 4 ms

Generally, in vector modulation, digital bits are transferred onto the carrier by changing the amplitude and phase of the RF carrier so that each bit occupies one of the fixed positions inside an I-Q plane (constellation diagram) for the data and clock signals. A data symbol is encoded by each position and one data symbol consists of one or more data bits. That is, in the case where n data bits are transferred per one symbol, 2n positions are necessary. Therefore, as the number of data bits per symbol increases, it is important to maintain the error vector magnitude (EVM) of the transmission signal so as to be low in order to ensure a predetermined communication error rate.

Here, as illustrated in FIG. 5, in the power amplification circuit of the comparative example, which is not provided with the bias control signal generating circuit 21, EVM degrades as the time passes from when the driving of the power amplifier starts. In contrast, according to the power amplification circuit that includes the bias control signal generating circuit 21, EVM can be kept low regardless of the passage of the time from when the driving of the power amplifier starts.

However, when the surrounding temperature of the power amplifier become high, the change in the voltage of the voltage signal of the power amplifier that occurs with the rise in temperature and the change in the temperature of the power amplifier itself are not linear and the amplification factor of the power amplifier is not appropriately compensated in the bias control signal generating circuit 21. Specifically, when the surrounding temperature of the power amplifier becomes high, for example, a voltage that is lower than the voltage corresponding to the temperature of the power amplifier itself is outputted as a voltage corresponding to the rise in the temperature of the power amplifier (temperature detection signal outputted from temperature sensor). In other words, when a change in the voltage of the voltage signal corresponding to a rise in the temperature of the power amplifier and the change in temperature of the power amplifier itself are illustrated as curves, the curve representing the voltage change and the curve representing the temperature change both increase up to a certain temperature, but then only the curve representing the voltage signal stops increasing once the certain temperature is exceeded. That is, once the certain temperature is exceeded, the curve representing the voltage changes does not exhibit the same changes as the curve representing the temperature changes of the power amplifier itself (linear changes), but rather exhibits different changes (non-linear changes). In this case, since a bias control signal corresponding to a voltage that is lower than the voltage representing the temperature of the power amplification circuit itself is generated in the bias control signal generating circuit 21, the amplification factor of the power amplifier is not appropriately compensated in the bias control signal generating circuit 21. As a result, particularly in an environment in which the surrounding temperature reaches a high temperature, there is a risk of the EVM undesirably increasing.

In contrast, when the power amplifier temperature detection circuit according to this embodiment is used, as the temperature of the power amplifier rises, the rate of the increase of the amplification factor increases with the rise in temperature, and therefore the amplification factor can be appropriately compensated by the bias control signal generating circuit 21 over a wide temperature range. Therefore, EVM can be kept low even in an environment in which the surrounding temperature reaches a high temperature.

Second Embodiment

In a second embodiment, an example of a temperature detection circuit that differs from the temperature detection circuit described in the first embodiment will be described.

Figure 6:
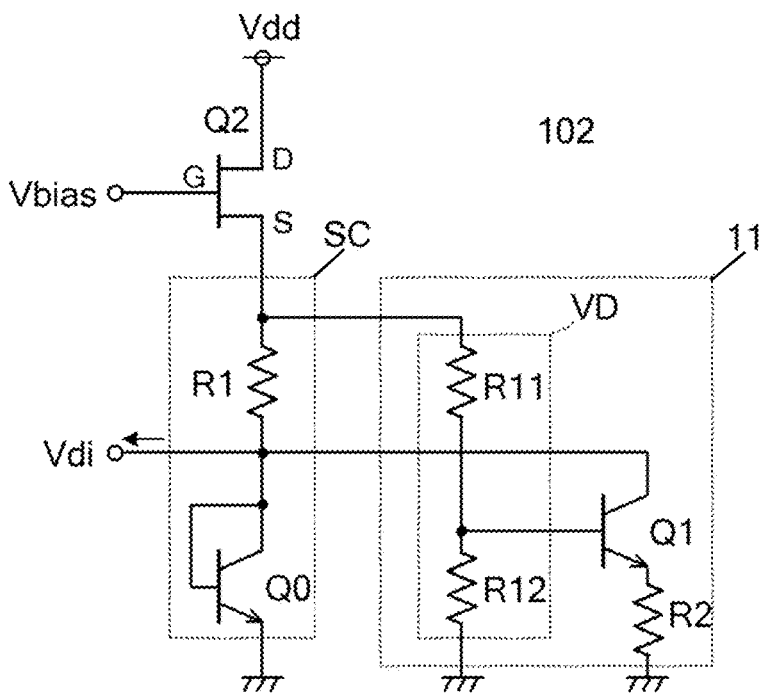
FIG. 6 is a circuit diagram of a power amplifier temperature detection circuit according to a second embodiment.

FIG. 6 is a circuit diagram of a temperature detection circuit 102 according to the second embodiment. The temperature detection circuit 102 includes the series connection circuit SC, a second transistor Q2, and the current bypass circuit 11. The series connection circuit SC is a series circuit consisting of the temperature detection transistor Q0 and the first resistance element R1. A drain D and a source S of the second transistor Q2 are connected in series with each other between a power supply voltage input terminal Vdd and the series connection circuit SC. Specifically, the drain D of the second transistor Q2 is serially connected to the power supply voltage input terminal Vdd and the source S of the second transistor Q2 is serially connected to the series connection circuit SC. In addition, alternatively, the drain D of the second transistor Q2 may be connected in series with the series connection circuit SC and the source S of the second transistor Q2 may be connected in series with the power supply voltage input terminal Vdd. The temperature detection signal Vdi is outputted from a connection part between the temperature detection transistor Q0 and the first resistance element R1.

In the temperature detection circuit 102 of this embodiment, the configuration of the series connection circuit SC is the same as that in the temperature detection circuit 101A illustrated in FIG. 2A.

In the configuration of the temperature detection circuit 102, the voltage applied to the series connection circuit SC is a voltage obtained by subtracting the gate-source voltage of the second transistor Q2 from a voltage Vbias. Therefore, provided that the externally generated voltage Vbias is a stabilized voltage, the power supply voltage supplied to the series connection circuit SC and the current bypass circuit 11 is constant and an appropriate temperature detection signal Vdi is outputted even in the case where the voltage of the power supply voltage input terminal Vdd is not constant. Therefore, even in the case where the power supply voltage fluctuates, a high-accuracy temperature detection signal can be obtained.

Furthermore, a resistance element R2 is connected between the emitter of the first transistor Q1 and ground in the current bypass circuit 11 of the temperature detection circuit 102. The rest of the configuration of the current bypass circuit 11 is the same as in the temperature detection circuit 101A illustrated in FIG. 2A. According to the configuration of the temperature detection circuit 102, the slope of the bypass current that flows through the first transistor Q1 with respect to temperature changes can be set using the value of the second resistance element R2. Furthermore, the excess current flowing through the first transistor Q1 in a high-temperature state can be restricted.

Third Embodiment

In a third embodiment, an example of a temperature detection circuit is described in which the configuration of the series connection circuit SC and the configuration of the current bypass circuit 11 are different from those in the temperature detection circuits described in the first and second embodiments.

Figure 7:
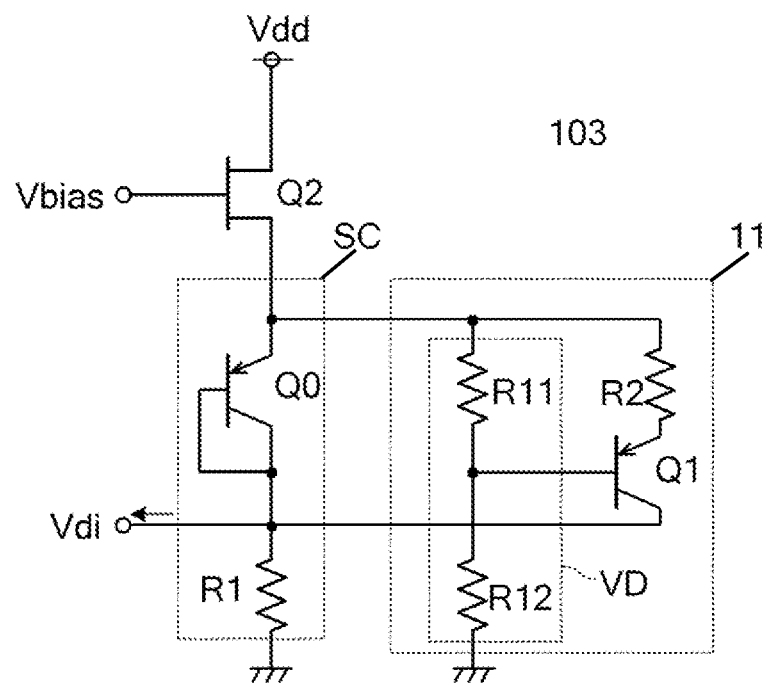
FIG. 7 is a circuit diagram of a power amplifier temperature detection circuit according to a third embodiment.

FIG. 7 is a circuit diagram of a temperature detection circuit 103 according to the third embodiment. The configuration of the series connection circuit SC and the configuration of the current bypass circuit 11 are different from those in the temperature detection circuit 102 illustrated in FIG. 6. The series connection circuit SC consists of the temperature detection transistor Q0 connected near the power supply voltage input terminal Vdd and the first resistance element R1 connected near ground. In addition, the current bypass circuit 11 is provided with the first transistor Q1, which is connected in parallel with the temperature detection transistor Q0. The rest of the configuration is the same as that of the temperature detection circuits described in the first embodiment and the second embodiment.

As described in this embodiment, the voltage between the two ends of the resistance element R1 of the series connection circuit SC may be generated as the temperature detection signal Vdi. However, in this embodiment, because of the relationship that the temperature detection signal Vdi increases as the temperature of the power amplifier rises, it is preferable that the circuit of the bias control signal generating circuit 21 which is disclosed in FIG. 1 be configured so that the bias voltage for the power amplifier PA is reduced as the voltage of the temperature detection signal Vdi increases.

Fourth Embodiment

In a fourth embodiment, an example of the configuration of an electronic device that includes a power amplification circuit will be described.

Figure 8:
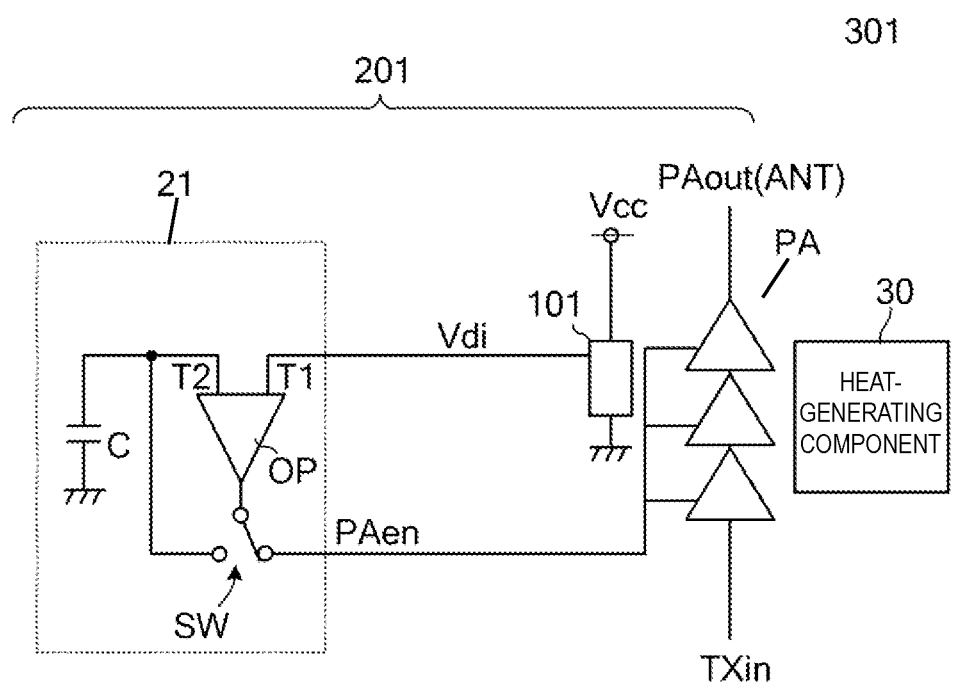
FIG. 8 is a diagram illustrating the configuration of an electronic device according to a fourth embodiment.

FIG. 8 is a diagram illustrating the configuration of an electronic device according to the fourth embodiment. This electronic device 301 includes the power amplification circuit 201 and a heat-generating component 30. The power amplification circuit 201 and the heat-generating component 30 are mounted on the same substrate. The heat-generating component 30 is a CPU or a battery, for example. The heat-generating component 30 is thermally coupled with the power amplifier PA. In other words, the temperature of the power amplifier PA increases due to the heat received from the heat-generating component 30 in addition to the heat generated by the power amplifier PA itself.

In the thus-structured electronic device 301, the bias voltage for the power amplifier PA is appropriately determined in accordance with the temperature of the PA even when the power amplifier PA is affected by the heat from the heat-generating component 30.

Finally, the descriptions of the above embodiments are illustrative in all points and should not be considered as restrictive. A person skilled in the art can make modifications and changes as appropriate. The scope of the present disclosure is defined by the following claims rather than by the above-described embodiments. In addition, changes from the embodiments that are within the scope of equivalents to the scope of the claims are included in the scope of the present disclosure.

For example, the second transistor Q2 inside the temperature detection circuits 102 and 103 may be formed of a bipolar transistor.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A temperature detection circuit comprising:
a series connection circuit that is connected between a power supply voltage input terminal and ground, the series connection circuit including a temperature detection element and a first resistance element; and
a current bypass circuit including a first transistor that is connected in parallel with the temperature detection element and allows a bypass current to flow therethrough, and a resistance voltage divider circuit that generates a bias voltage for the first transistor,
wherein the temperature detection circuit outputs a temperature detection signal from a signal output terminal that is connected to a connection point between the temperature detection element and the first resistance element, and
wherein the resistance voltage divider includes a series circuit of a first resistance element and a second resistance element connected between the power supply voltage input terminal and ground.

2. The temperature detection circuit according to claim 1, wherein the first transistor is a bipolar transistor.

3. The temperature detection circuit according to claim 1, wherein the temperature detection element includes a PN junction.

4. A temperature detection circuit comprising:
a series connection circuit that is connected between a power supply voltage input terminal and ground, the series connection circuit including a temperature detection element and a first resistance element;
a current bypass circuit including a first transistor that is connected in parallel with the temperature detection element and allows a bypass current to flow therethrough; and
a second transistor provided with a control terminal, a reference terminal, and a current input/output terminal,
wherein the temperature detection circuit outputs a temperature detection signal from a connection point between the temperature detection element and the first resistance element, and
wherein the reference terminal and the current input/output terminal are serially connected between the series connection circuit and the power supply voltage input terminal and a control voltage is applied to the control terminal.

5. The temperature detection circuit according to claim 1, further comprising:
a second resistance element that is serially connected to a reference potential terminal of the first transistor.

6. The temperature detection circuit according to claim 4, further comprising:
a second resistance element that is serially connected to a reference potential terminal of the first transistor.

7. A power amplification circuit comprising:
the temperature detection circuit according to claim 1;
a bias control signal generating circuit that receives the temperature detection signal and generates a bias control signal; and
a power amplifier that receives the bias control signal and performs power amplification using a bias voltage in accordance with the bias control signal,
wherein the temperature detection element detects at least a temperature of the power amplifier.

8. A temperature detection circuit comprising:
a series connection circuit that is connected between a power supply voltage input terminal and ground, the series connection circuit including a temperature detection element and a first resistance element, which is serially connected to the temperature detection element between the power supply voltage input terminal and ground;

a current bypass circuit including a first transistor that is connected in parallel with the temperature detection element and allows a bypass current to flow therethrough and a resistance voltage divider circuit;

and a signal output terminal that is connected to a node on a path connecting the temperature detection element and the first resistance element, wherein the resistance voltage divider includes a series circuit of a first resistance element and a second resistance element, a first end of the first resistance element is connected to the power supply voltage input terminal and a second end of the first transistor element is connected to a control terminal of the first transistor, a first end of the second resistance element is connected to the control terminal of the first transistor and a second end of the second resistance element is connected to ground.

9. The temperature detection circuit according to claim 8, wherein the first transistor is a bipolar transistor.

10. The temperature detection circuit according to claim 8, wherein the temperature detection element includes a PN junction.

11. The temperature detection circuit according to claim 8, further comprising:

a second transistor provided with a control terminal, a reference terminal, and a current input/output terminal, wherein the reference terminal and the current input/output terminal are serially connected between the series connection circuit and the power supply voltage input terminal and a control voltage is applied to the control terminal.

12. The temperature detection circuit according to claim 8, further comprising:

a second resistance element that is serially connected to a reference potential terminal of the first transistor.

13. A power amplification circuit comprising:

the temperature detection circuit according to claim 8;

a bias control signal generating circuit that receives a signal output from the signal output terminal and generates a bias control signal; and a power amplifier that receives the bias control signal and performs power amplification using a bias voltage in accordance with the bias control signal, wherein the temperature detection element detects at least a temperature of the power amplifier.

14. The power amplification circuit according to claim 13, wherein the power amplifier, the temperature detection circuit, and the bias control signal generating circuit are formed in a single semiconductor chip.

15. The power amplification circuit according to claim 13, wherein the bias control signal generating circuit includes a differential amplification circuit having a first input terminal and a second input terminal, a capacitor connected to the second input terminal of the differential amplification circuit; and a switch connected to an output of the differential amplification circuit, the switch configured to switch between a state in which an output voltage of the differential amplification circuit charges the capacitor and a state in which the output voltage of the differential amplification circuit is outputted to the power amplifier as the temperature detection signal; and the temperature detection circuit is connected to the first input terminal of the differential amplification circuit.

16. An electronic device comprising:

the power amplification circuit according to claim 7; and a heat-generating component, wherein the heat-generating component and the power amplifier are mounted on the same substrate.

17. An electronic device comprising:

the power amplification circuit according to claim 13; and a heat-generating component, wherein the heat-generating component and the power amplifier are mounted on the same substrate.

18. An electronic device comprising:

the power amplification circuit according to claim 15; and a heat-generating component, wherein the heat-generating component and the power amplifier are mounted on the same substrate.

* * * * *